United States Patent
Nitta et al.

(10) Patent No.: US 6,949,798 B2
(45) Date of Patent: Sep. 27, 2005

(54) SEMICONDUCTOR DEVICE

(75) Inventors: Tetsuya Nitta, Hyogo (JP); Tadaharu Minato, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/416,287

(22) PCT Filed: Jan. 28, 2002

(86) PCT No.: PCT/JP02/00584
§ 371 (c)(1),
(2), (4) Date: May 9, 2003

(87) PCT Pub. No.: WO03/065459
PCT Pub. Date: Aug. 7, 2003

(65) Prior Publication Data
US 2004/0150040 A1 Aug. 5, 2004

(51) Int. Cl.[7] ............................................. H01L 29/76
(52) U.S. Cl. ..................... 257/341; 257/342; 257/339
(58) Field of Search ................... 257/341, 342, 257/339, 487, 488, 493, 77, 494, 495

(56) References Cited

U.S. PATENT DOCUMENTS

| | | | |
|---|---|---|---|
| 5,506,421 A | * | 4/1996 | Palmour ..................... 257/77 |
| 6,040,600 A | | 3/2000 | Uenishi et al. |
| 6,291,856 B1 | * | 9/2001 | Miyasaka et al. ............ 257/335 |
| 6,359,308 B1 | * | 3/2002 | Hijzen et al. ................ 257/341 |
| 6,518,144 B2 | * | 2/2003 | Nitta et al. .................. 438/424 |
| 6,768,170 B2 | * | 7/2004 | Zhou .......................... 257/341 |

FOREIGN PATENT DOCUMENTS

| | | |
|---|---|---|
| JP | 11-233759 | 8/1999 |
| JP | 2000-114520 | 4/2000 |
| JP | 2000-277726 | 10/2000 |
| JP | 2000-286417 | 10/2000 |
| JP | 2001-102577 | 4/2001 |
| JP | 2001-111041 | 4/2001 |
| JP | 2001-119022 | 4/2001 |
| JP | 2001-144292 | 5/2001 |
| JP | 2001-168036 | 6/2001 |
| JP | 2001-313391 | 11/2001 |

OTHER PUBLICATIONS

"Analysis of the Effect of Charge Imbalance on the Static and Dynamic Characteristics of the Super Junction MOSFET", Praveen M. Shenoy, et al., 1999 IEEE, pp. 99–102.

* cited by examiner

Primary Examiner—Mark V. Prenty
(74) Attorney, Agent, or Firm—McDermott Will & Emery LLP

(57) ABSTRACT

The semiconductor device of the present invention has a repeat structure of repeated unit structures in a semiconductor substrate (1), each unit structure having an n type diffusion region (3) and a p type diffusion region (4) in contact with each other to form a pn junction sandwiched between trenches (1a). An impurity amount in the n type diffusion region (3) and an impurity amount in the p type diffusion region (4) in the unit structure are set unequal (or different). Thus, in the semiconductor device having the trenches (1a), favorable breakdown voltage and avalanche breakdown tolerance can be ensured at the same time.

9 Claims, 13 Drawing Sheets

SEMICONDUCTOR DEVICE

This application is the National Phase of International Application PCT/JP02/00584, filed on Jan. 28, 2002, which designated the United States.

TECHNICAL FIELD

The present invention relates to a semiconductor device, and more particularly to improvement in performance of a semiconductor device using a RESURF effect.

BACKGROUND ART

A device employing a repeat structure of n type and p type layers of fine size (hereinafter, referred to as the "pn repeat structure") applying field relaxation phenomena called a RESURF (Reduced SURface Field) effect, in place of a uniform n type drift layer of a conventional MOSFET (Metal Oxide Semiconductor Field Effect Transistor), has been proposed, e.g., in U.S. Pat. No. 6,040,600.

In the pn repeat structure where the n type and p type layers are provided repeatedly, the drift layers are likely to experience depletion, which is advantageous in that impurity concentrations of the drift layers can be increased and thus on-state resistance can be reduced. As such, an STM (Super Trench power MOSFET) structure is obtained which can achieve a breakdown voltage several times greater than a main breakdown voltage normally obtained with a single n type drift layer of high concentration. Hereinafter, the STM structure disclosed in U.S. Pat. No. 6,040,600 is described as a conventional example.

FIG. 19 is a schematic cross sectional view of a conventional STM structure. Referring to FIG. 19, a first main surface of a semiconductor substrate 101 is provided with a plurality of repeated trenches 101a. Provided within a region sandwiched between trenches 101a are n type and p type diffusion regions 103 and 104. N type diffusion region 103 is provided on a sidewall surface of one trench 101a and p type diffusion region 104 is provided on a sidewall surface of another trench 101a. N type and p type diffusion regions 103 and 104 constitute a pn junction along a depth direction of trench 101a.

A p type body region 105 is formed on the first main surface side of n type and p type diffusion regions 103, 104. A source $n^+$ diffusion region 106 is provided within p type body region 105 on the sidewall surface of one trench 101a. A gate electrode layer 109 is formed along the sidewall surface of one trench 101a such that gate electrode layer 109 is opposite to p type body region 105 sandwiched between source $n^+$ diffusion region 106 and n type diffusion region 103, with a gate insulating layer 108 disposed between p type body region 105 and gate electrode layer 109.

Trench 101a is filled with a filling layer 110 formed of an insulator. A $p^+$ diffusion region 107 is provided on the first main surface side of filling layer 110 and is in contact with p type body region 105. Furthermore, an $n^+$ region of semiconductor substrate 101 is located on a second main surface side of the repeat structure consisting of n type and p type diffusion regions 103, 104 and trenches 101a.

A source electrode layer 111 is formed on the first main surface to electrically connect with p type body region 105, source $n^+$ diffusion region 106 and $p^+$ diffusion region 107. A drain electrode layer 112 is formed on the second main surface to electrically connect with $n^+$ region 101.

In this structure, total amounts of charges in neighboring n type and p type diffusion region 103 and 104 are made equal to each other to assure a high breakdown voltage.

When n type and p type diffusion regions 103, 104 adjacent to each other have equal total charge amounts, however, electric field strength upon avalanche breakdown (when held at a main breakdown voltage) would become approximately uniform in a region for forming n type and p type diffusion regions 103, 104. In such a case, an avalanche current would cause positive feedback, undesirably decreasing avalanche breakdown tolerance (non-clamp inductive load switching breakdown tolerance).

In particular, with the STM as shown in FIG. 19, impurities within n type and p type diffusion regions 103, 104 are localized in the vicinity of the sidewalls of trenches 101a, as shown in FIG. 20. Thus, at the time of avalanche breakdown described above, a current flows locally in the vicinity of the sidewalls of trenches 101a, as shown in FIG. 21. As such, the STM has an effective current density greater than that of another device having a uniform drift concentration, making the STM particularly inferior in avalanche breakdown tolerance.

FIG. 21 shows the simulation result, in which regions having high dot distribution densities within n type and p type diffusion regions 103, 104 each correspond to a region of high current density.

DISCLOSURE OF THE INVENTION

An object of the present invention is, in an STM or multi RESURF type semiconductor device where a current flow is localized to a sidewall of a trench upon avalanche breakdown, to maintain a high breakdown voltage and also to improve distribution of electric field strength in a breakdown state at the time of avalanche breakdown so as to increase avalanche breakdown tolerance.

A semiconductor device according to an aspect of the present invention has a repeat structure of repeated unit structures, each having a first impurity region of a first conductivity type and a second impurity region of a second conductivity type in contact with each other to form a pn junction sandwiched between trenches, in a semiconductor substrate of the first conductivity type. The first impurity region and the second impurity region in each unit structure have impurity amounts unequal to each other.

According to the semiconductor device of the aspect of the present invention, the first and second impurity regions sandwiched between the trenches have their impurity amounts differentiated from each other. Thus, the avalanche breakdown tolerance can be improved even in a device such as an STM especially vulnerable to avalanche breakdown.

In addition, provision of the repeat structure of the repeated first and second impurity regions produces the RESURF effect, and thus, a high breakdown voltage can be realized.

Preferably, in the semiconductor device of the aspect described above, a ratio of the impurity amount in the second impurity region to the impurity amount in the first impurity region in each unit structure is either not more than 0.99 or not less than 1.04.

This remarkably improves the avalanche breakdown tolerance.

More preferably, in the semiconductor device of the aspect described above, a ratio of the impurity amount of the second impurity region to the impurity amount of the first impurity region in each unit structure is either not less than 0.95 and not more than 0.99, or not less than 1.04 and not more than 1.10.

This assures remarkable improvement of the avalanche breakdown tolerance and further guarantees a more favorable breakdown voltage than in a common MOSFET.

Still preferably, in the semiconductor device of the aspect described above, an insulative gate type field effect transistor is formed at a main surface of the semiconductor substrate sandwiched between the trenches in each unit structure.

This allows the STM to have favorable avalanche breakdown tolerance and high breakdown voltage.

Preferably, in the semiconductor device of the aspect described above, the first and second impurity regions in each unit structure serve as a diode.

This also allows the diode to have favorable avalanche breakdown tolerance and high breakdown voltage.

Preferably, in the semiconductor device of the aspect described above, the first and second impurity regions in each unit structure have impurity densities unequal to each other.

Differentiating the impurity densities of the first and second impurity regions from each other makes it possible to differentiate the impurity amounts in the first and second impurity regions.

Still preferably, in the semiconductor device of the aspect described above, the first and second impurity regions in each unit structure have volumes unequal to each other.

Differentiating the volumes of the first and second impurity regions from each other makes it possible to differentiate the impurity amounts in the first and second impurity regions.

Preferably, in the semiconductor device of the aspect described above, the semiconductor substrate is made of SiC.

As such, it is possible to choose a material other than Si as the material of the semiconductor substrate.

Preferably, the semiconductor device of the aspect described above further includes a third impurity region of the second conductivity type in each unit structure. The third impurity region is formed to contact the second impurity region and to jut out toward the first impurity region side.

Such a device provided with the third impurity region of the second conductivity type formed to jut out toward the first impurity region side can still have favorable avalanche breakdown tolerance and high breakdown voltage.

A semiconductor device according to another aspect of the present invention has a repeat structure of repeated unit structures, each having a first impurity region of a first conductivity type and a second impurity region of a second conductivity type arranged in parallel with each other, in a semiconductor substrate of the first conductivity type. The semiconductor device includes a charged layer arranged to contact at least one of the first and second impurity regions in each unit structure. In each unit structure, a sum of an amount of negative charges in the charged layer and an amount of p type impurity in the silicon layer is unequal to a sum of an amount of positive charges in the charged layer and an amount of n type impurity in the silicon layer.

According to the semiconductor device of the another aspect of the present invention, provision of the charged layer makes it possible to differentiate the sum of the amount of negative charges in the charged layer and the amount of p type impurity in the silicon layer from the sum of the amount of positive charges in the charged layer and the amount of n type impurity in the silicon layer. Thus, avalanche breakdown tolerance can be improved.

In addition, provision of the repeat structure of the repeated first and second impurity regions produces the RESURF effect, and thus, a high breakdown voltage can be realized.

A semiconductor device according to a further aspect of the present invention has a repeat structure of repeated unit structures, each having a first impurity region of a first conductivity type and a second impurity region of a second conductivity type in contact with each other to form a pn junction, in a semiconductor substrate of the first conductivity type. At least one of a guard ring and a field plate arranged at a peripheral portion of the repeat structure has a breakdown voltage that is lower than a breakdown voltage obtained inside the repeat structure.

According to the semiconductor device of the further aspect of the present invention, the guard ring and/or the field plate at the peripheral portion of the repeat structure have/has a breakdown voltage lower than in the repeat structure. This causes the avalanche breakdown to occur in the peripheral portion of the repeat structure before the interior of the repeat structure. As a result, the avalanche breakdown tolerance of the device can be improved.

BEST MODES FOR CARRYING OUT THE INVENTION

Hereinafter, embodiments of the present invention will be described with reference to the drawings.

FIRST EMBODIMENT

Figure 1:
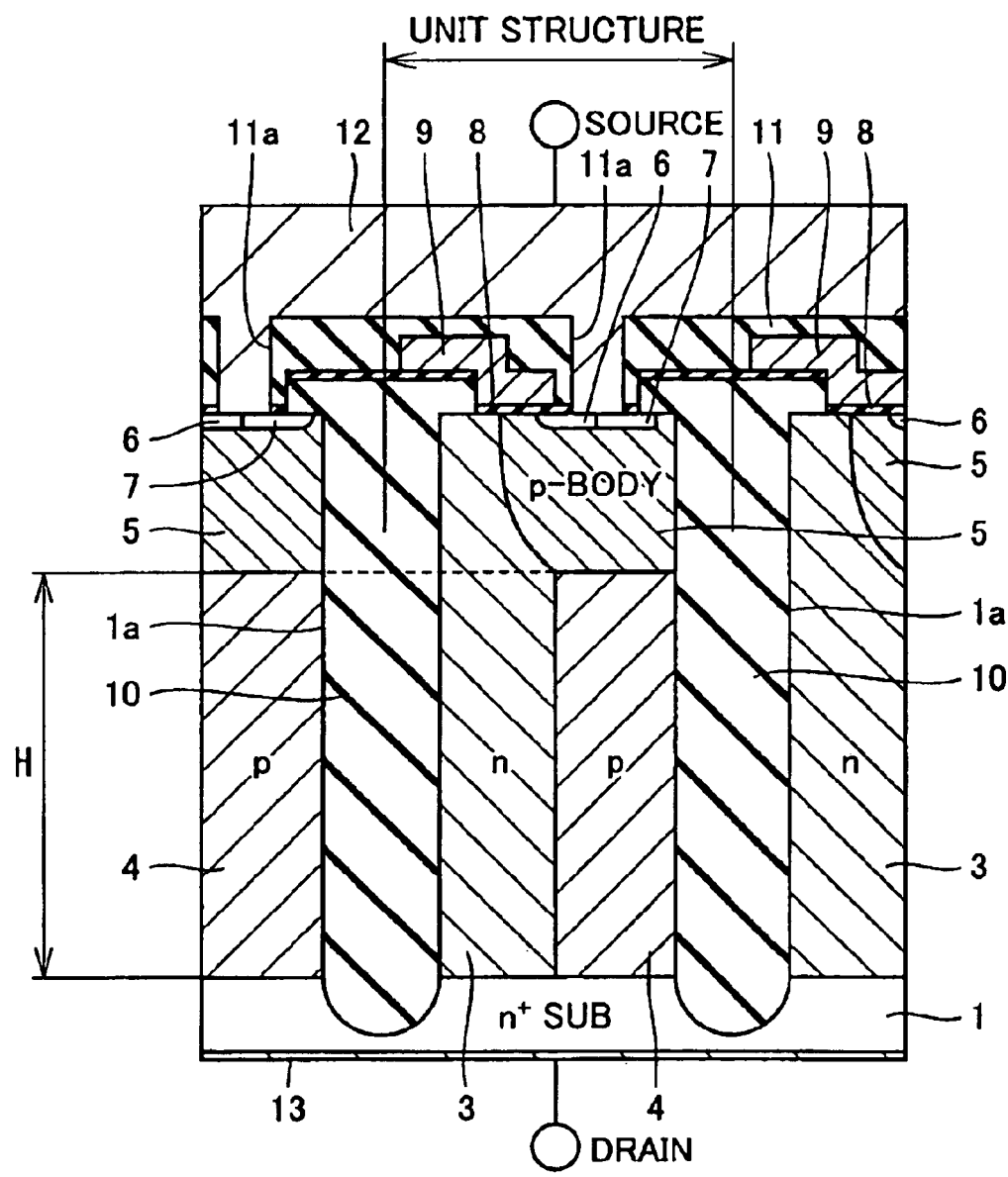
FIG. 1 is a schematic cross sectional view of a configuration of a semiconductor device according to a first embodiment of the present invention.

Referring to FIG. 1, a first main surface (upper main surface in the plane of the drawing) of a semiconductor substrate 1 is provided with a plurality of repeated trenches 1a. Each trench 1a is filled with a filling layer 10 made of an insulator such as silicon (including monocrystal, polycrystal, amorphous, and microcrystal) of low impurity density, a silicon oxide film or the like. N type and p type diffusion regions 3, 4 are provided in a mesa region sandwiched between trenches 1a. N type diffusion region 3 is provided on a sidewall surface of one trench 1a, and p type diffusion region 4 is provided on a sidewall surface of another trench 1a. These n type and p type diffusion regions 3 and 4 constitute a pn junction along a depth direction of trenches 1a.

Figure 20:
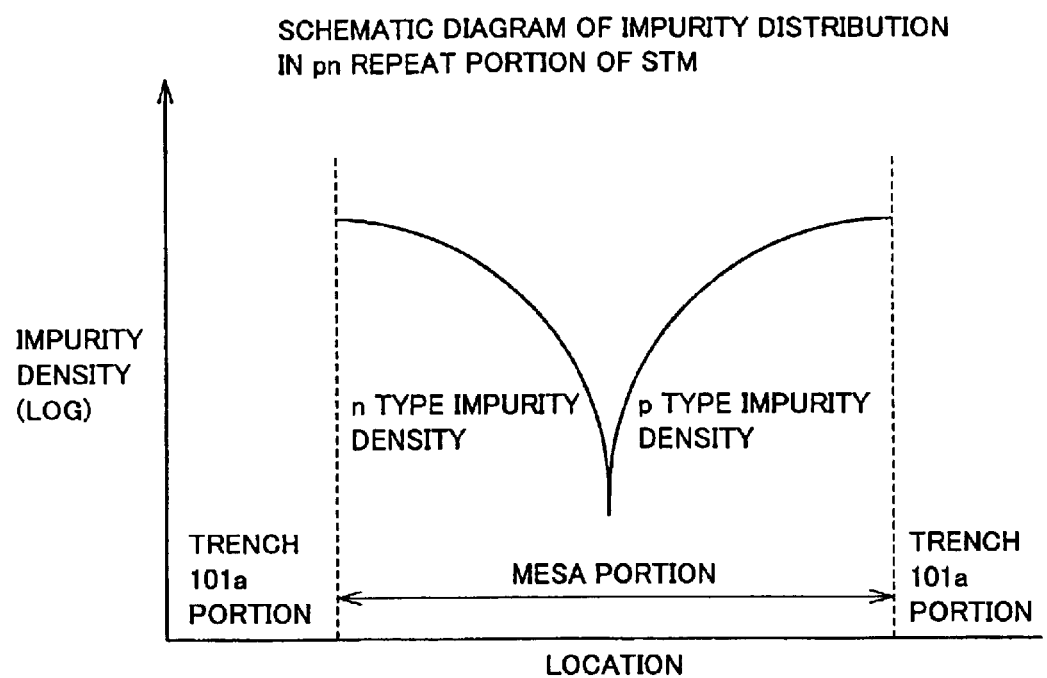
FIG. 20 shows impurity concentration distribution in n type and p type diffusion regions adjacent to each other shown in FIG. 19.
Figure 21:
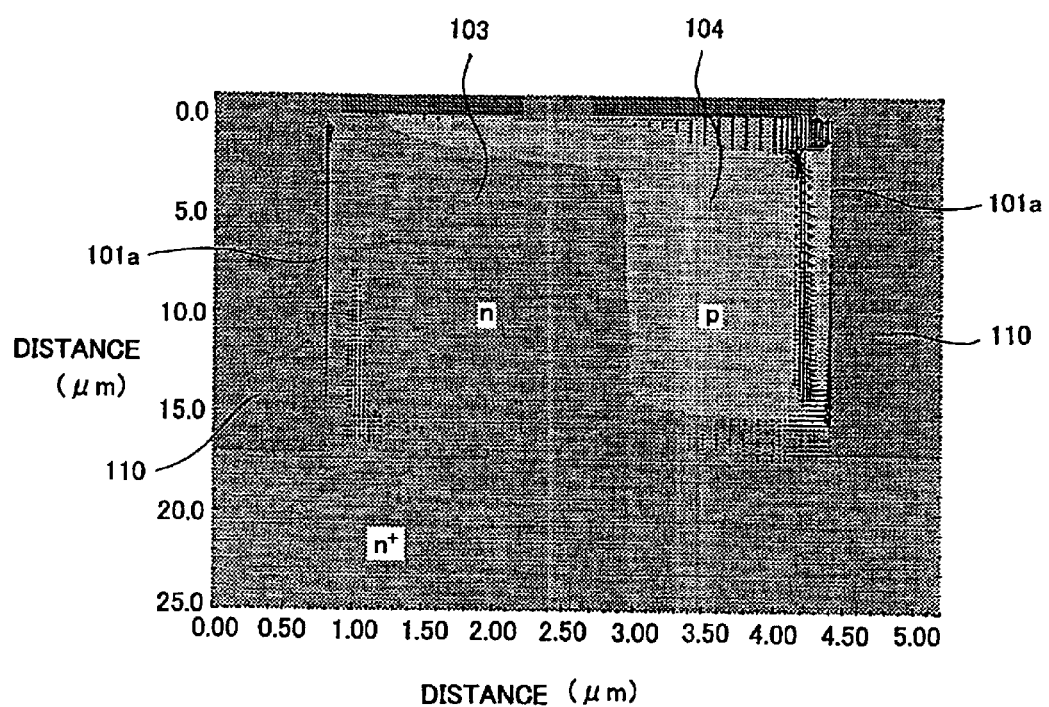
FIG. 21 shows a simulation result indicating that current is localized in the vicinity of-sidewalls of trenches in the STM.

Such a unit structure with n type and p type diffusion regions 3, 4 sandwiched between trenches 1a is provided repeatedly. N type diffusion region 3 and p type diffusion region 4 in each unit structure have impurity concentration distribution approximately the same as shown in FIG. 20.

A p type body region 5 is formed on the first main surface side of p type diffusion region 4 in each unit structure, jutting out toward the n type diffusion region 3 side. A source $n^+$ diffusion region 6 and a $p^+$ diffusion region 7 are formed adjacent to each other at the first main surface within p type body region 5. A gate electrode layer 9 is formed on the first main surface such that it is opposite to p type body region 5 sandwiched between source $n^+$ diffusion region 6 and n type diffusion region 3, with a gate insulating layer 8 disposed therebetween. Gate electrode layer 9 has one end in contact with filling layer 10.

An insulating layer 11 is formed to cover the entire first main surface, and a contact hole 11a is formed in insulating layer 11 to partially expose a surface of each of source $n^+$ diffusion region 6 and $p^+$ diffusion region 7. A source electrode layer 12 is formed on insulating layer 11 to electrically connect with both source $n^+$ diffusion region 6 and $p^+$ diffusion region 7 via contact hole 11a. An $n^+$ region of semiconductor substrate 1 is located on a second main surface side of the repeat structure of n type and p type diffusion regions 3, 4 and trenches 1a. A drain electrode layer 13 is formed on the second main surface to electrically connect with the $n^+$ region of semiconductor substrate 1.

The impurity amount in n type diffusion region 3 is set unequal to (or unbalanced with) that in p type diffusion region 4 in each unit structure.

Here, such unbalanced impurity amounts in n type and p type diffusion regions 3, 4 mean that, in FIG. 1, n type and p type diffusion regions 3, 4 in a region H where n type and p type diffusion regions 3, 4 form a pn junction in the depth direction of the semiconductor substrate have their impurity amounts unbalanced with each other.

Figure 2:
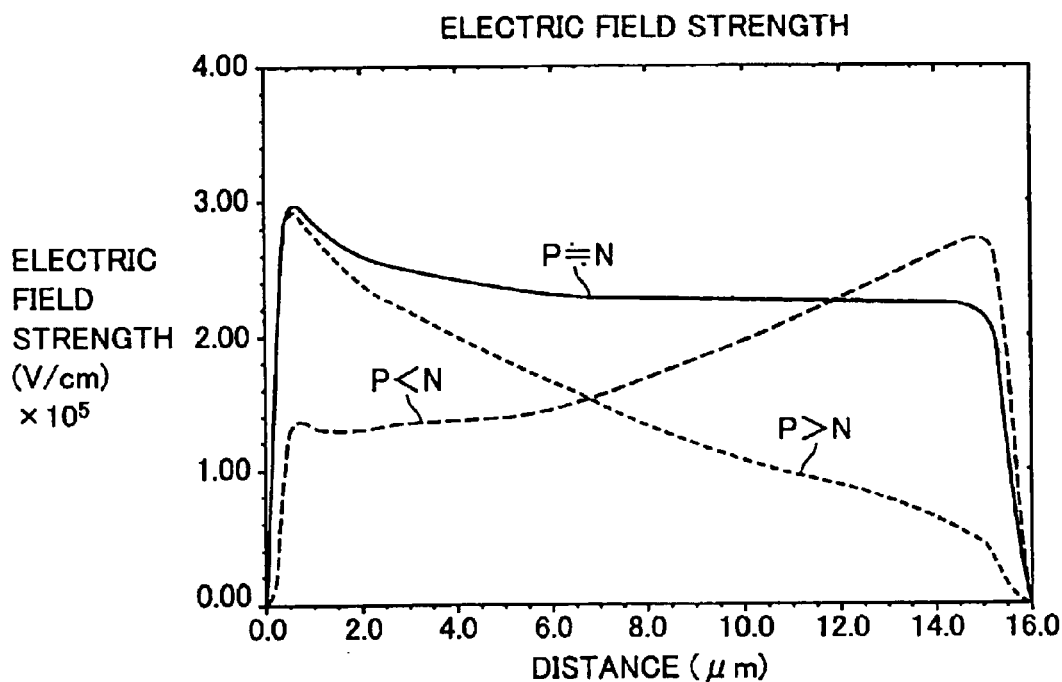
FIG. 2 shows simulation analysis results of changes in distribution of electric field strength in an n type impurity region in the case where impurity doses in neighboring p type and n type impurity regions in FIG. 1 are changed.

The inventors examined, by simulation analysis, a change in distribution of electric field strength in n type diffusion region 3 in the depth direction in the case where the impurity amount in n type diffusion region 3 and that in p type diffusion region 4 in each unit structure in FIG. 1 were changed. FIG. 2 shows the results.

Referring to FIG. 2, when the impurity amounts in n type and p type diffusion regions 3 and 4 are approximately the same (P≈N), the RESURF effect is maximized. Thus, the distribution of electric field strength in n type diffusion region 3 becomes flat, with an electric field close to the breakdown field ($\approx 2 \times 10^5$ V/cm to $3 \times 10^5$ V/cm) acting over nearly the entire region. By comparison, when the impurity amounts are set unbalanced (P<N, P>N), the RESURF effect is reduced, and the distribution of electric field strength changes. Thus, the electric field approximating the breakdown field acts only on a limited region. As such, a region where the electric field close to the breakdown field is imposed is smaller when the impurity amounts in n type and p type diffusion regions 3, 4 are unbalanced, leading to increased avalanche breakdown tolerance.

When the impurity amounts in n type and p type diffusion regions 3, 4 are unbalanced, however, the RESURF effect is less obvious, leading to decreased breakdown voltage. Thus, it is important to properly set the degree of unbalance, to improve the total performance of the device.

In FIG. 2, the horizontal axis represents a depth from the first main surface of semiconductor substrate 1, and the vertical axis represents electric field strength.

The inventors examined a desirable degree of unbalance between the impurity amounts in n type and p type diffusion regions 3, 4 in the STM as shown in FIG. 1. The case of the STM, however, cannot be considered the same way as the case of another device unprovided with trenches, since n type and p type diffusion regions 3, 4 are formed by implanting ions from sidewall surfaces of the trenches, as will be described later.

Thus, the inventors examined a change of avalanche breakdown tolerance and a change of performance index (trade-off characteristic between on-state resistance and main breakdown voltage) along with a change of the ratio between effective p type impurity dose and effective n type impurity dose. Results obtained are shown in FIGS. 3 and 4.

Figure 3:
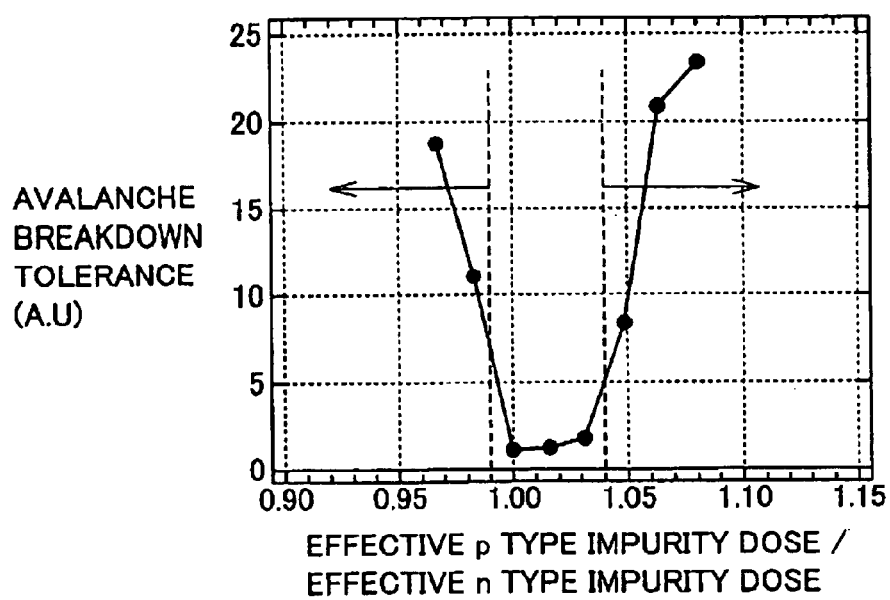
FIG. 3 shows a change of avalanche breakdown tolerance in the case where a ratio between effective p type impurity dose and effective n type impurity dose is changed.

Referring to FIG. 3, it has been found that avalanche breakdown tolerance suddenly increases and remarkably improves when the ratio of effective p type impurity dose to effective n type impurity dose becomes not greater than 0.99 or not less than 1.04. Thus, it is preferable that the ratio of effective p type impurity dose to effective n type impurity dose is not more than 0.99 or not less than 1.04.

The "effective dose" in the above description is not an actual dose, but a dose corresponding to ions which effectively act as impurity ions after completion of the process, which corresponds to the dose with which the highest breakdown voltage is obtained.

Figure 4:
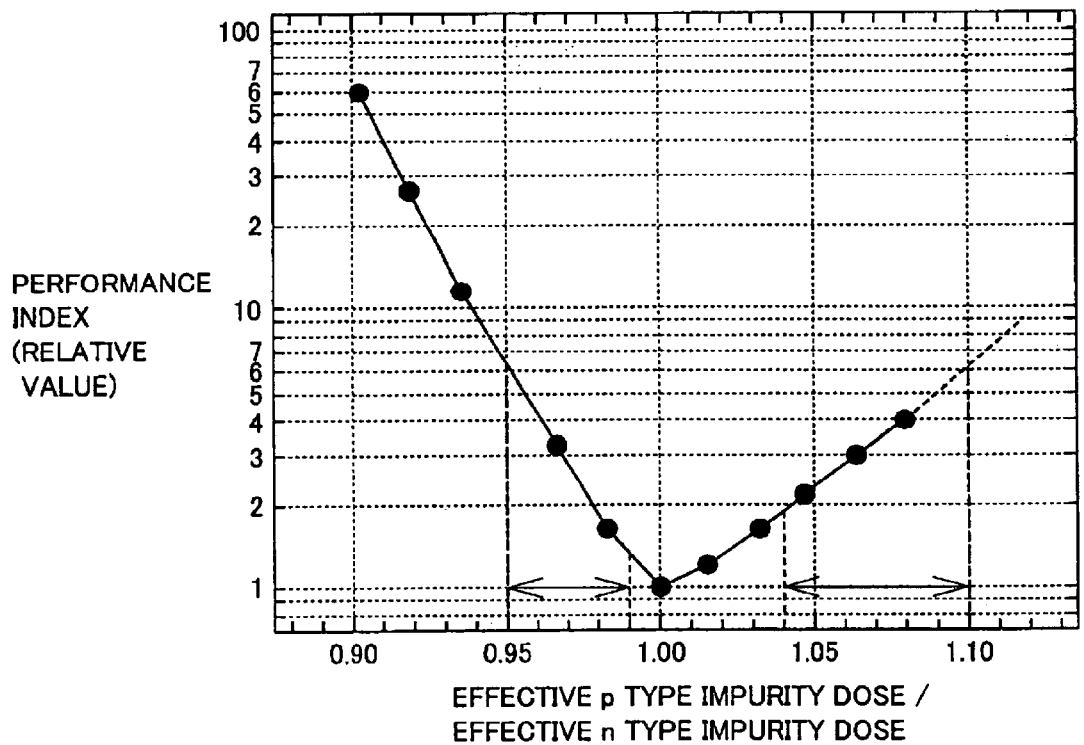
FIG. 4 shows a change of performance index in the case where a ratio between the effective p type impurity dose and the effective n type impurity dose is changed.

Referring next to FIG. 4, the graph has a vertical axis indicating a performance index, which is defined as follows.

The on-state resistivity of a MOSFET is related to a silicon limit value dependent on a breakdown voltage, which is calculated by the following expression.

$$\text{Silicon limit } (\Omega\text{cm}^2) = 5.9 \times 10^{-9} \times \text{main breakdown voltage}^{2.5} \quad \text{(V)}$$

With a ratio of on-state resistance to silicon limit in the case where n type and p type diffusion regions 3 and 4 are best balanced as the reference, a ratio of on-state resistance to silicon limit in another case is used as a performance index. The performance index is expressed as follows.

Performance index=(On-state resistivity under a certain condition/Silicon limit corresponding to a breakdown voltage under the certain condition)/(On-state resistivity when best balanced/Silicon limit corresponding to a breakdown voltage when best balanced)

When the impurity amounts in n type diffusion region 3 and in p type diffusion region 4 are made unbalanced in order to improve the avalanche breakdown tolerance, the on-state resistance will increase and the breakdown voltage will decrease, leading to an unfavorable performance index (with an increased value). It is desirably restricted up to about five times the value when best balanced. It has been found, from the measured data shown in FIG. 4, that a ratio of effective p type impurity dose to effective n type impurity dose in a range from 0.95 to 1.10 results in a performance index of not greater than about 5.

The reason why the performance index of up to about 5 is determined tolerable is as follows.

Unbalanced impurity amounts in n type diffusion region 3 and p type diffusion region 4 is preferable from the standpoint of improvement of avalanche breakdown tolerance. In the STM, however, such unbalance between n type diffusion region 3 and p type diffusion region 4 leads to degradation of trade-off characteristic (performance index) between the on-state resistance and the main breakdown voltage. Thus, it is important to decide to which extent such unbalance is acceptable. The indicator is that "the on-state resistance is lower than the silicon limit value". An on-state resistance greater than a silicon limit value is in principle feasible even in a common MOSFET, which lessens the benefit of extremely low on-state resistance of the STM.

In the STM, drift layers 3, 4 are formed along the sidewalls of trenches 1a. This facilitates formation of a small cell pitch, and can improve the trade-off characteristic (performance index) between the on-state resistance and the main breakdown voltage, compared to other multi RESURF devices. According to the result of simulation, the STM can obtain an on-state resistance of not greater than about one fifth of the silicon limit when the p type impurity amount and the n type impurity amount are best balanced. In other words, it can have properties superior to those of a common MOSFET even in the case where the p type impurity amount and the n type impurity amount are made unbalanced to improve avalanche breakdown tolerance and thus the characteristic (performance index) is degraded to the extent of up to about five times.

As such, in the STM, it is possible to select a balance between n type diffusion region 3 and p type diffusion region 4 that can realize "high avalanche breakdown tolerance" and "good trade-off characteristic between on-state resistance and main breakdown voltage" at the same time. In the case of the other multi RESURF devices, it is difficult to reduce the pitch as in the case of the STM. There are cases where the balance range between n type diffusion region 3 and p type diffusion region 4 ensuring the "high avalanche breakdown tolerance" and the "good trade-off characteristic between on-state resistance and main breakdown voltage" at the same time is extremely narrow, or such a balance range ensuring the two conditions at the same time may not exist in the case of a device exhibiting a characteristic of only about a half of the silicon limit.

From the results in FIGS. 3 and 4, the ratio of effective p type impurity dose to effective n type impurity dose for ensuring favorable avalanche breakdown tolerance and good trade-off characteristic (performance index) between on-state resistance and main breakdown voltage is preferably not lower than 0.95 and not greater than 0.99, or not lower than 1.04 and not greater than 1.10.

Now, a method of manufacturing the semiconductor device of the present embodiment is described.

Figure 5:
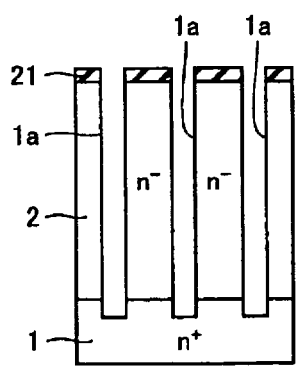
FIGS. 5–9 are schematic cross sectional views illustrating successive steps of a manufacturing method of the semiconductor device according to the first embodiment of the present invention.

Referring to FIG. 5, firstly, a semiconductor substrate having an n$^+$ region 1 and an n$^-$ region 2 is prepared. Anisotropic etching is carried out in a conventional manner, with a silicon oxide film formed by CVD (chemical vapor deposition) or the like being used as a mask material 21, to form a plurality of trenches 1a at a first main surface of the semiconductor substrate.

Figure 6:
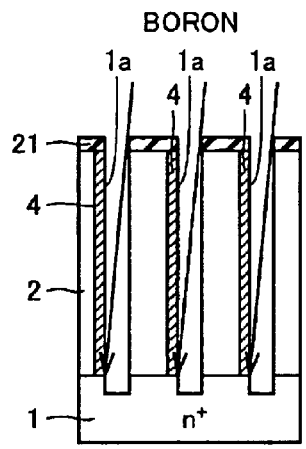

Referring to FIG. 6, boron ions are implanted into one sidewall of each of trenches 1a formed in stripes, so that a boron ion-implanted region 4 is formed.

Figure 7:
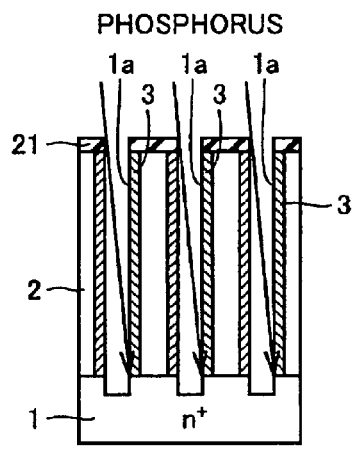

Referring to FIG. 7, phosphorus ions are implanted into the opposite sidewall of each of trenches 1a formed in stripes, so that a phosphorus ion-implanted region 3 is formed. Here, the doses of boron and phosphorus are set such that their effective impurity amounts are unbalanced. The steps in FIGS. 6 and 7 may be performed in reverse order.

Figure 8:
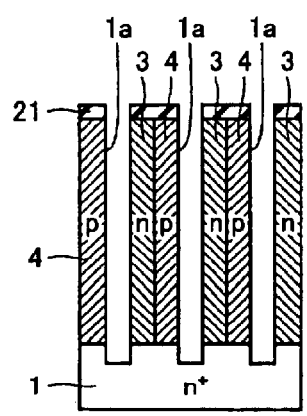

Referring to FIG. 8, boron ion-implanted region 4 and phosphorus ion-implanted region 3 are diffused by heat treatment at the same time, and a p type diffusion region 4 and an n type diffusion region 3 having desired impurity concentration profiles are formed.

Figure 9:
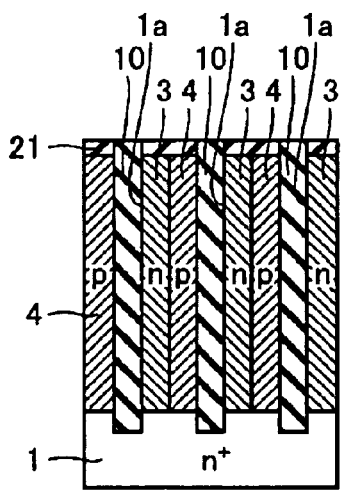

Referring to FIG. 9, trench 1a is filled with a filling layer 10 of, e.g., silicon oxide film formed by CVD.

In this manner, a repeat structure of repeated unit structures, each having n type diffusion region 3 and p type diffusion region 4 placed in contact with each other to form a pn junction and sandwiched by trenches 1a, is formed. The STM as shown in FIG. 1 can be manufactured through succeeding various processes.

Since ions are implanted from the sidewalls of trenches 1a as described above, n type and p type diffusion regions 3, 4 each have an impurity concentration that is the highest near the sidewall of trench 1a and decreases as a depth toward the inside of the mesa region increases.

Figure 10:
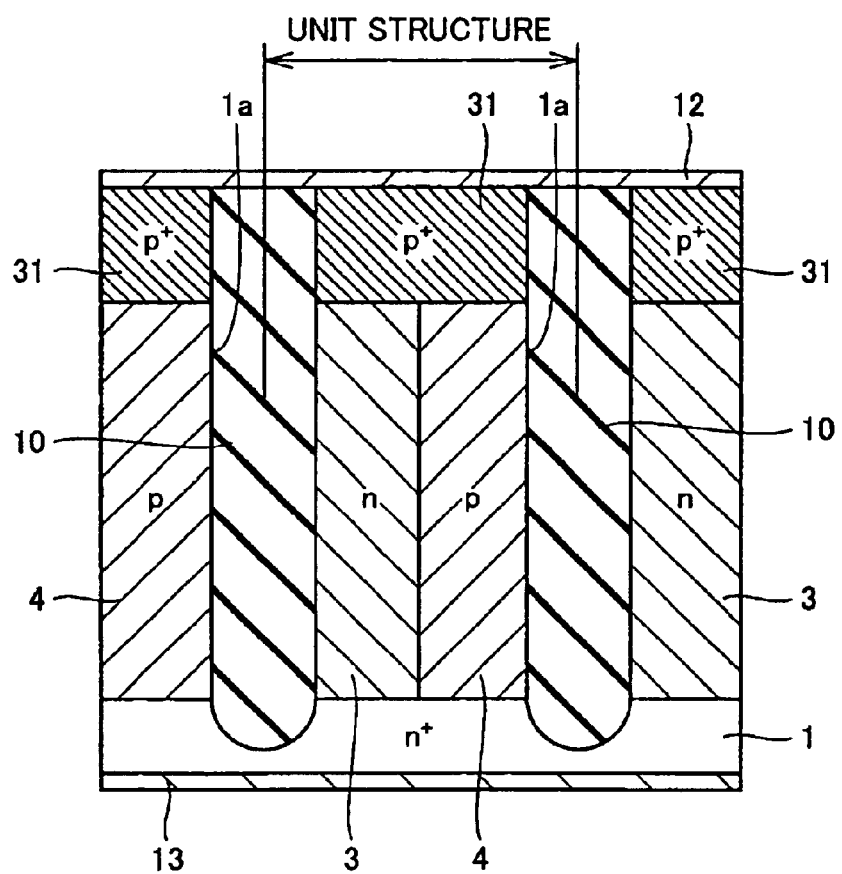
FIG. 10 is a schematic cross sectional view of a configuration of a diode as the semiconductor device of the first embodiment of the present invention.
Figure 11:
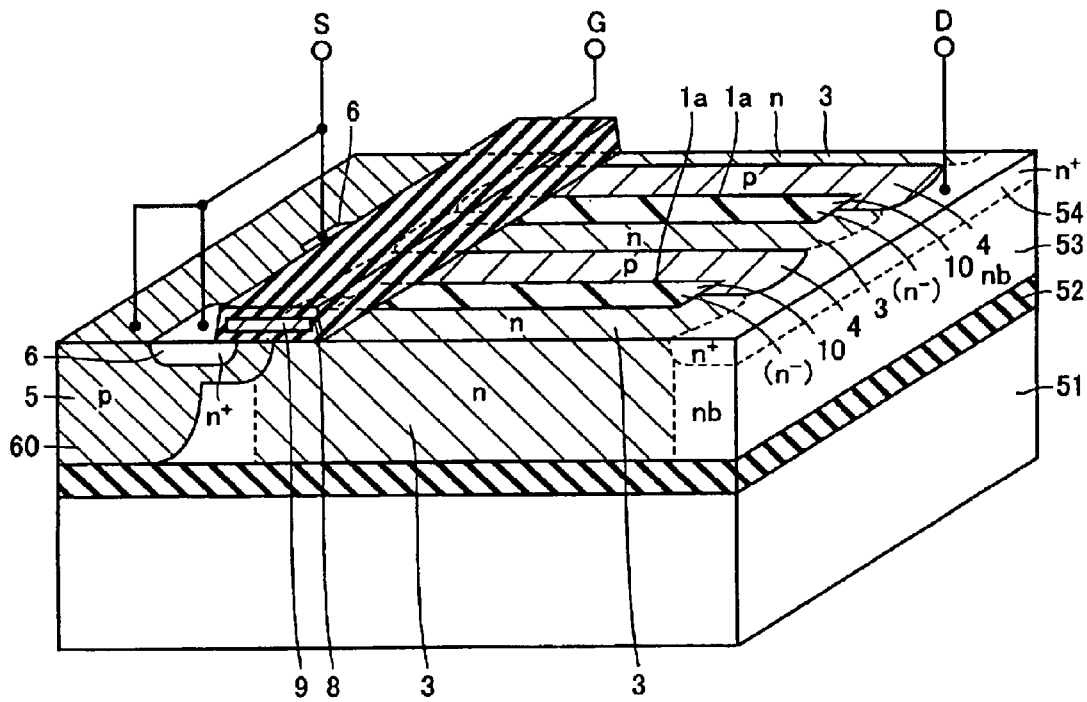
FIG. 11 is a schematic perspective view of a configuration of a lateral MOSFET as the semiconductor device of the first embodiment of the present invention.
Figure 12:
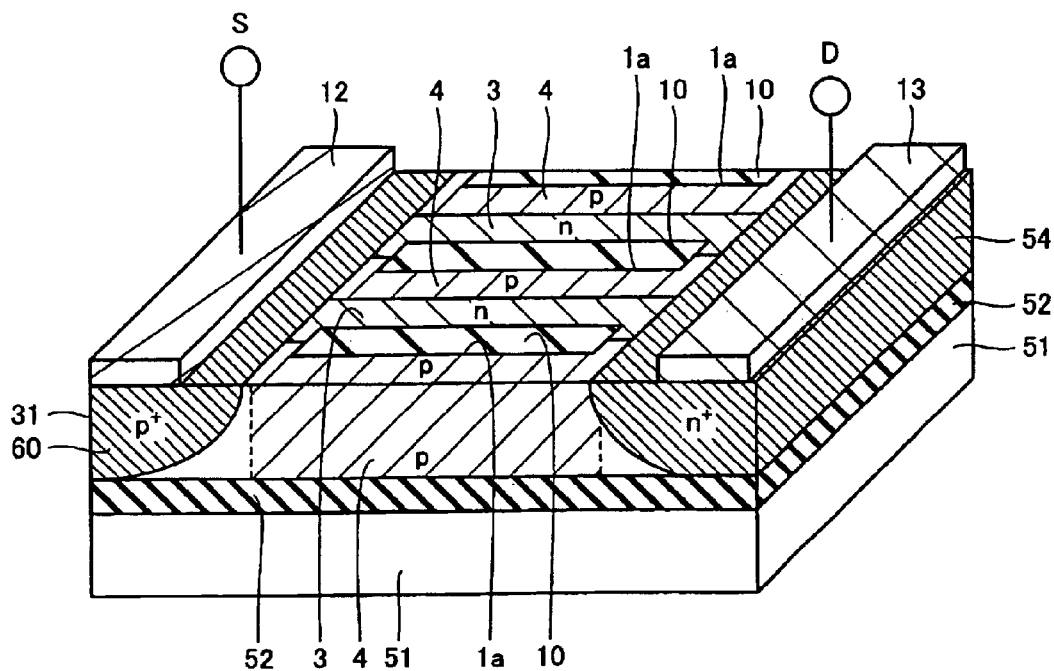
FIG. 12 is a schematic perspective view of a configuration of a lateral diode as the semiconductor device of the first embodiment of the present invention.

Although the STM has been described as a device in which n type diffusion region 3 and p type diffusion region 4 constituting the pn junction have their impurity amounts unbalanced with each other, the device may be applied to a vertical diode as shown in FIG. 10, a lateral MOSFET as shown in FIG. 11, and a lateral diode as shown in FIG. 12.

Referring to FIG. 10, this diode has repeated unit structures each having n type and p type diffusion regions 3, 4 in contact with each other to form a pn junction sandwiched between trenches 1a. N type and p type diffusion regions 3, 4 in each unit structure have a first main surface side on which a p$^+$ impurity region 31 is formed, and an electrode 12 is electrically connected to this p$^+$ impurity region 31. Further, they have a second main surface side on which an n$^+$ region of semiconductor substrate 1 is located, and an electrode 13 is electrically connected to this n$^+$ region.

Otherwise, the configuration is approximately identical to that shown in FIG. 1, so that description thereof is not repeated here.

In this diode, again, impurity amounts of n type and p type diffusion regions 3, 4 constituting the pn junction are set unbalanced. Thus, avalanche breakdown tolerance can be improved as described above.

Referring to FIG. 11, a semiconductor layer 60 is formed on silicon substrate 51 with an insulative film 52 such as silicon oxide film disposed therebetween. A lateral MOSFET is formed in this semiconductor layer 60.

In semiconductor layer 60, unit structures each having n type diffusion region 3 and p type diffusion region 4 in contact with each other to form a pn junction sandwiched between trenches 1a, are formed repeatedly. Trench 1a is filled with filling layer 10. A p type region 5 is formed on one end of the repeat structure of the unit structures. An n$^+$ source region 6 is formed at the surface within the range of p type region 5, and is electrically connected to a source electrode.

A gate electrode layer 9 is formed such that it is opposite to a portion of p type region 5 sandwiched between n type diffusion region 3 and n$^+$ source region 6 via a gate insulating layer 8. This gate electrode layer 9 extends on the first main surface, along a direction in which the unit structures are provided repeatedly. On the other end of the repeat structure, an n$^+$ impurity region 54 and an nb region 53 are formed. N$^+$ impurity region 54 is electrically connected to a drain electrode.

Otherwise, the configuration is approximately identical to the configuration shown in FIG. 1, so that description thereof is not repeated here.

In this lateral MOSFET, again, n type and p type diffusion regions 3, 4 constituting the pn junction have their impurity amounts unbalanced with each other. Accordingly, avalanche breakdown tolerance can be improved as described above.

Referring to FIG. 12, a semiconductor layer 60 is formed on silicon substrate 51 with an insulative film 52 of silicon oxide film or the like disposed therebetween. A lateral diode is formed in this semiconductor layer 60.

In semiconductor layer 60, unit structures each having n type diffusion region 3 and p type diffusion region 4 in contact with each other to form a pn junction sandwiched between trenches 1a, are formed repeatedly. Trench 1a is filled with filling layer 10.

As such, the unit structures each having n type diffusion region 3 and p type diffusion region 4 in contact with each other to form a pn junction sandwiched between trenches 1a are formed repeatedly at the surface of the semiconductor substrate, and each trench 1a is filled with filling layer 10. A p$^+$ impurity region 31 is formed on one end of the repeat structure of the unit structures, and a source electrode 12 is electrically connected to this p$^+$ impurity region 31. An n$^+$ impurity region 54 is formed on the other end of the repeat structure, and a drain electrode 13 is electrically connected to this n$^+$ impurity region 54.

Otherwise, the configuration is approximately the same as in FIG. 1, so that description thereof is not repeated here.

In this lateral diode, again, n type and p type diffusion regions 3, 4 constituting the pn junction have their impurity amounts set unbalanced. Thus, the avalanche breakdown tolerance can be improved as described above.

In each of the configurations shown in FIGS. 1 and 10–12, the material for semiconductor substrate 1 is not limited to silicon (Si). It may be made of SiC.

Further, the impurity amounts in n type diffusion region 3 and p type diffusion region 4 may be made unbalanced by differentiating (or making unbalanced) the impurity density in n type diffusion region 3 and that in p type diffusion region 4. Still further, the impurity amounts in n type diffusion region 3 and p type diffusion region 4 may be made unbalanced by differentiating (or making unbalanced) the volume of n type diffusion region 3 and that of p type diffusion region 4.

SECOND EMBODIMENT

Figure 13:
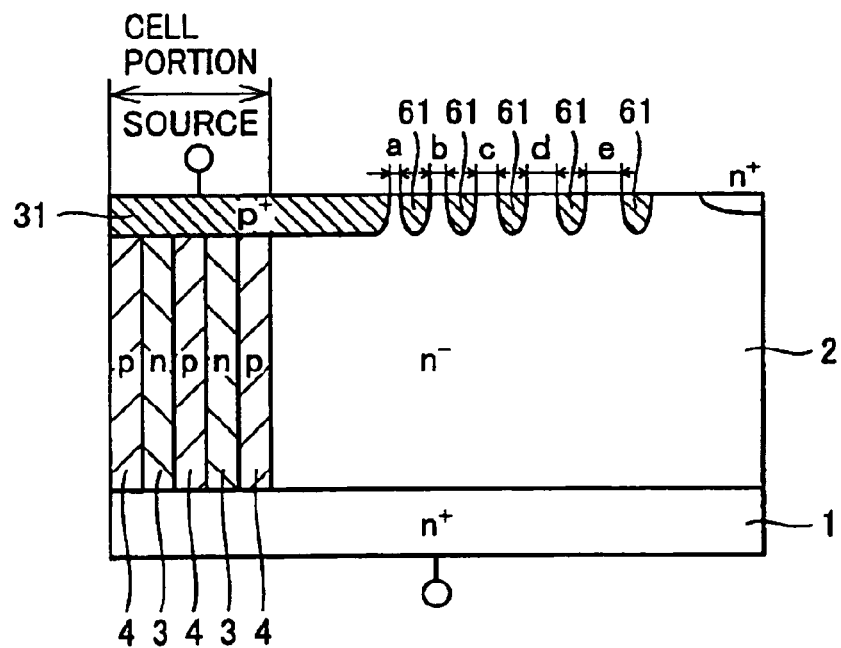
FIG. 13 is a schematic cross sectional view of a configuration of a semiconductor device according to a second embodiment of the present invention.

Referring to FIG. 13, a diode is formed in the cell portion. This diode includes a pn repeat structure having n type diffusion region 3 and p type diffusion region 4 in contact with each other to form a pn junction provided repeatedly, a p type well 31 formed on a first main surface side of the pn repeat structure, and an n$^+$ substrate region 1 located on a second main surface side of the pn repeat structure. Guard rings 61 are formed to surround a peripheral region of the cell portion five times, for example. Guard ring 61 has a breakdown voltage that is set lower than that of the cell portion.

Setting of the breakdown voltage of guard ring 61 lower than that of the cell portion can be done in various ways, e.g., by narrowing a respective ring interval between guard rings 61.

In general, the breakdown voltage of the guard ring portion is set greater than that of the cell portion. When the breakdown voltage of the cell portion is 300 V, ring intervals a, b, c, d and e between guard rings 61 are generally set to 5 μm, 7 μm, 9 μm, 11 μm and 13 μm, respectively, such that the breakdown voltage of the guard ring portion exceeds 300 V.

By comparison, in the present embodiment, any one of ring intervals a, b, c, d and e between guard rings 61 is reduced to approximately a half of the dimension described above. This can make the breakdown voltage of the guard ring portion smaller than 300 V, or, lower than the breakdown voltage of the cell portion.

In the present embodiment, the breakdown voltage of guard rings 61 surrounding the periphery of the cell portion is set lower than that of the cell portion. Therefore, the peripheral portion of the cell portion experiences avalanche breakdown prior to the cell portion itself, and as a result, the avalanche breakdown tolerance of the device can be improved.

Figure 14:
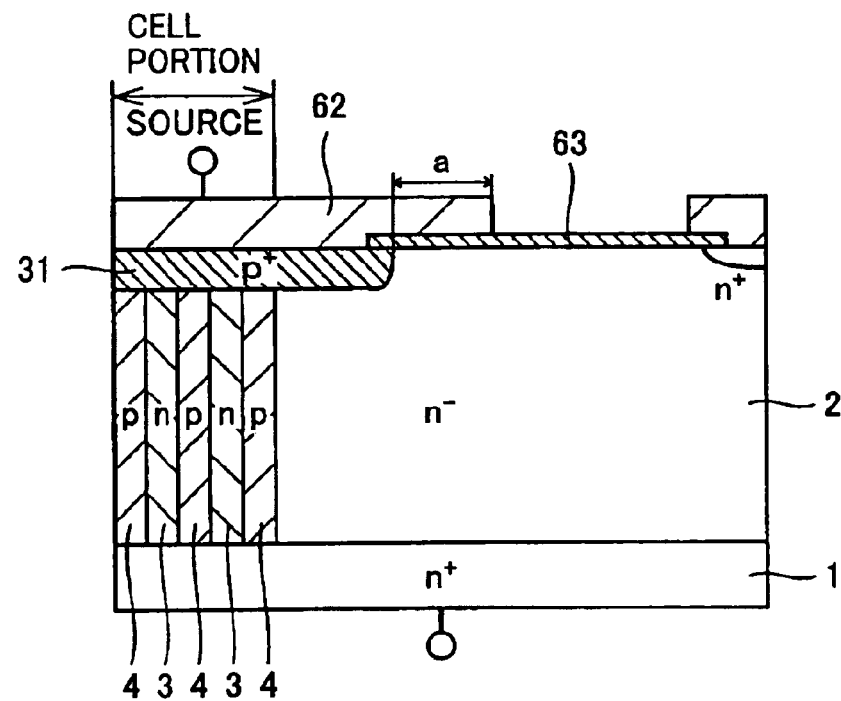
FIG. 14 is a schematic cross sectional view of another configuration of the semiconductor device of the second embodiment of the present invention.

Although guard rings 61 have been described above, the periphery of the cell portion may be surrounded by a field plate, as shown in FIG. 14. Specifically, electrode 62 electrically connected to p type well 31 may be extended to the periphery of the cell portion such that it is opposite to n$^-$ region 2 with an insulating layer 63 sandwiched therebetween, to constitute a field plate. The breakdown voltage of the field plate is set lower than that of the cell portion.

Otherwise, the configuration is almost identical to that shown in FIG. 13, and thus, the same members are denoted by the same reference characters and description thereof is not repeated here.

In the case of a common field plate, the breakdown voltage of the field plate portion is determined according to a width "a" where electrode 62 is opposite to n$^-$ region 2. In general, the breakdown voltage of the field plate is set greater than that of the cell portion. Thus, when the cell portion has a breakdown voltage of 100 V, for example, width "a" is set to the order of 10 μm such that the breakdown voltage of the field plate portion exceeds 100 V.

By comparison, in the present embodiment, the width "a" is narrowed to approximately a half (on the order of 5 μm). This makes the breakdown voltage of the field plate portion smaller than 100 V, or, lower than the breakdown voltage of the cell portion.

In the present embodiment, the field plate surrounding the periphery of the cell portion is made to have a breakdown voltage lower than that of the cell portion. As such, the peripheral portion will experience avalanche breakdown earlier than the cell portion. As a result, the avalanche breakdown tolerance of the device can be improved.

Figure 15:
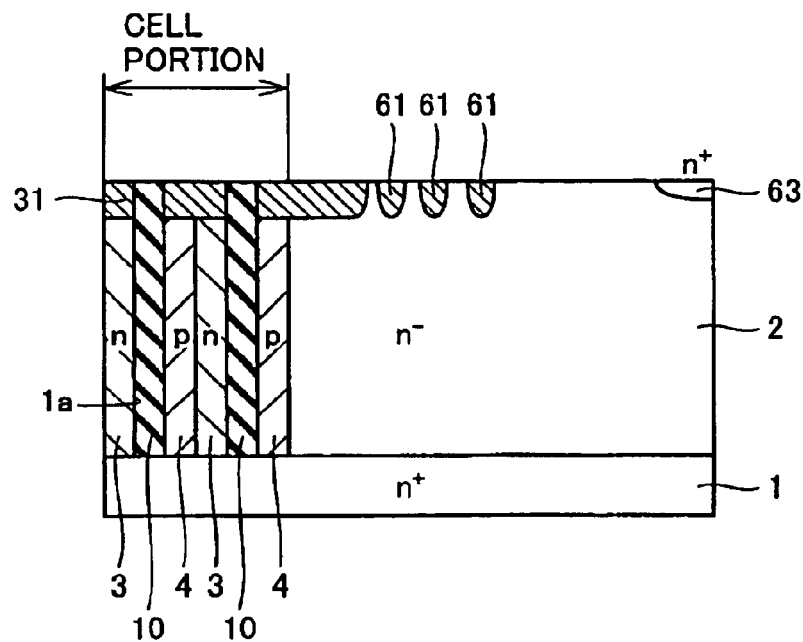
FIG. 15 is a schematic cross sectional view of yet another configuration of the semiconductor device of the second embodiment of the present invention.
Figure 16:
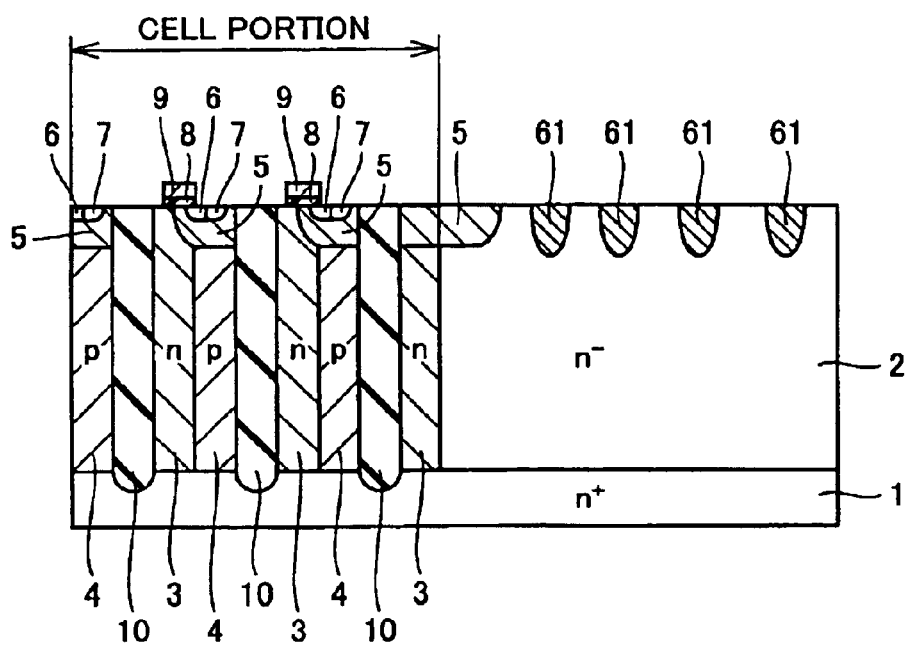
FIG. 16 is a schematic cross sectional view of still another configuration of the semiconductor device of the second embodiment of the present invention.

The cell portion may have, as shown in FIG. 15, a configuration identical to that of the diode shown in FIG. 10 (the configuration where a set of n type and p type diffusion regions 3, 4 is sandwiched between trenches 1a). Alternatively, the cell portion may have, as shown in FIG. 16, a configuration of the STM shown in FIG. 1. Therefore, both in the diode having trenches (FIG. 15) and in the STM (FIG. 16), avalanche breakdown occurs in the peripheral portion of the cell portion before it occurs in the cell portion. As a result, avalanche breakdown tolerance of the device can be improved.

THIRD EMBODIMENT

Figure 17:
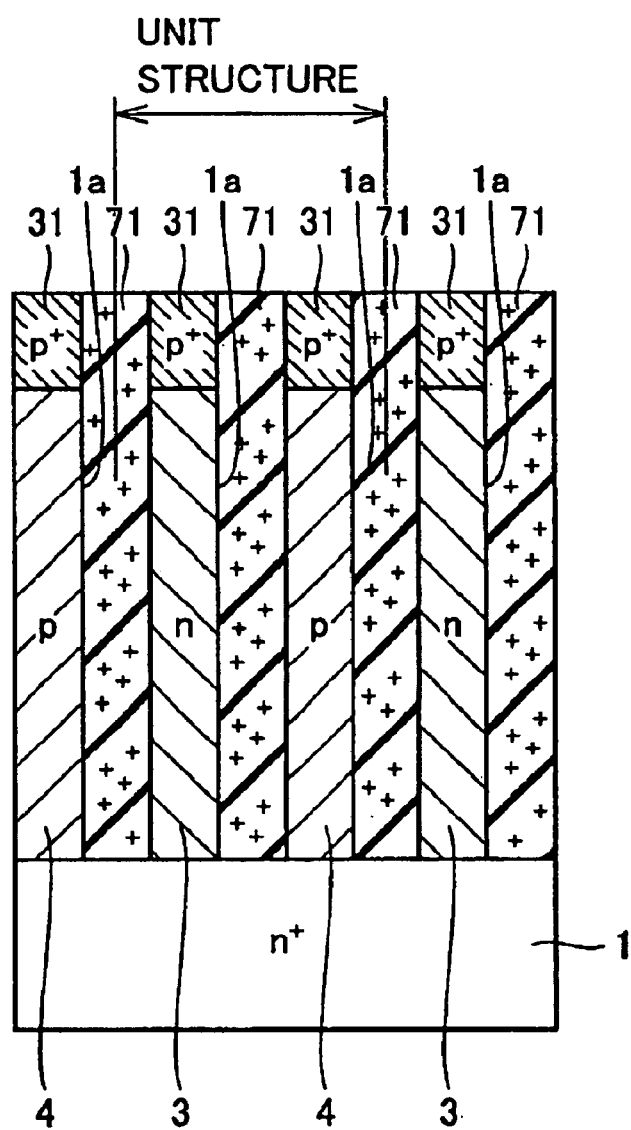
FIG. 17 is a schematic cross sectional view of a configuration of a semiconductor device according to a third embodiment of the present invention.

Referring to FIG. 17, a plurality of trenches 1a are formed at a first main surface of a semiconductor substrate 1. In a respective region sandwiched by trenches 1a, an n type diffusion region 3 and a p type diffusion region 4 are formed alternately. A p⁺ impurity region 31 is formed on the first main surface side of n type diffusion region 3 and p type diffusion region 4. Trench 1a is filled with a charged layer 71 of insulative film or semi-insulative film charged with positive or negative charges.

An n⁺ region of semiconductor substrate 1 is located on a second main surface side of n type diffusion region 3, p type diffusion region 4 and charged layer 71.

When n type and p type diffusion regions 3, 4 sandwiched between trenches 1a and charged layer 71 are regarded as a unit structure, a sum of an amount of positive charges and an amount of n type impurity within the unit structure is different from (or unbalanced with) a sum of an amount of negative charges and an amount of p type impurity within the same unit structure. That is, provision of charged layer 71 charged with positive or negative charges within the unit structure provides the same effect as in the case where the impurity amounts in n type diffusion region 3 and p type diffusion region 4 within a unit structure are made unbalanced with each other. Accordingly, it is possible to improve the avalanche breakdown tolerance as in the first embodiment.

Figure 18:
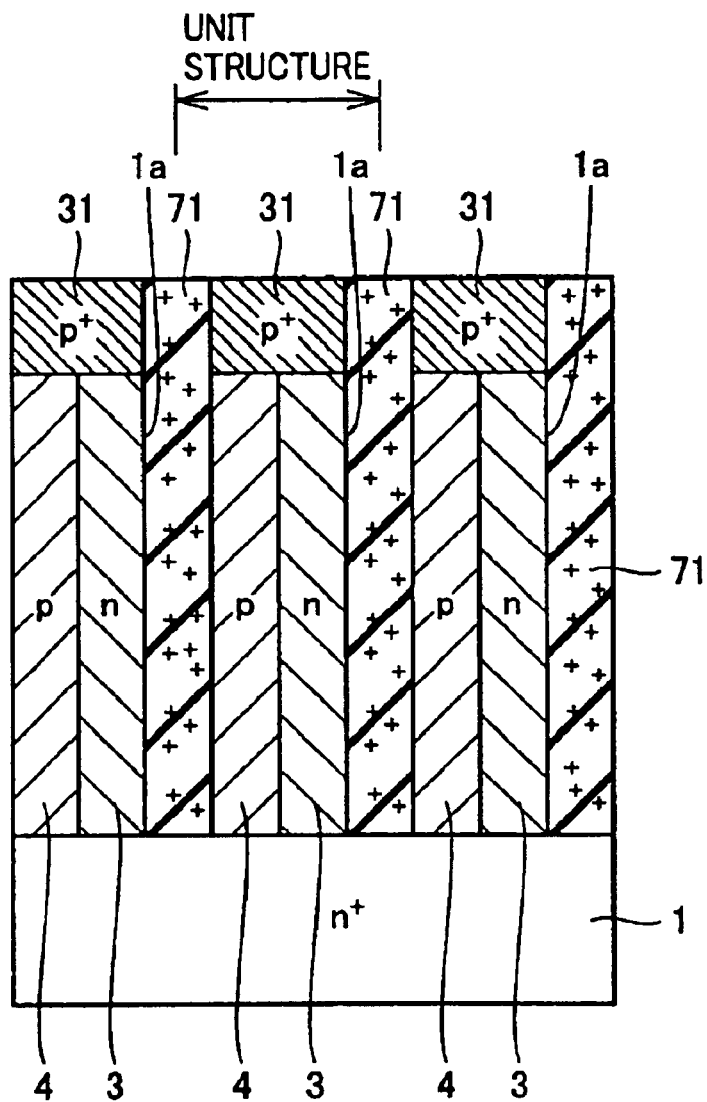
FIG. 18 is a schematic cross sectional view of another configuration of the semiconductor device of the third embodiment of the present invention.
Figure 19:
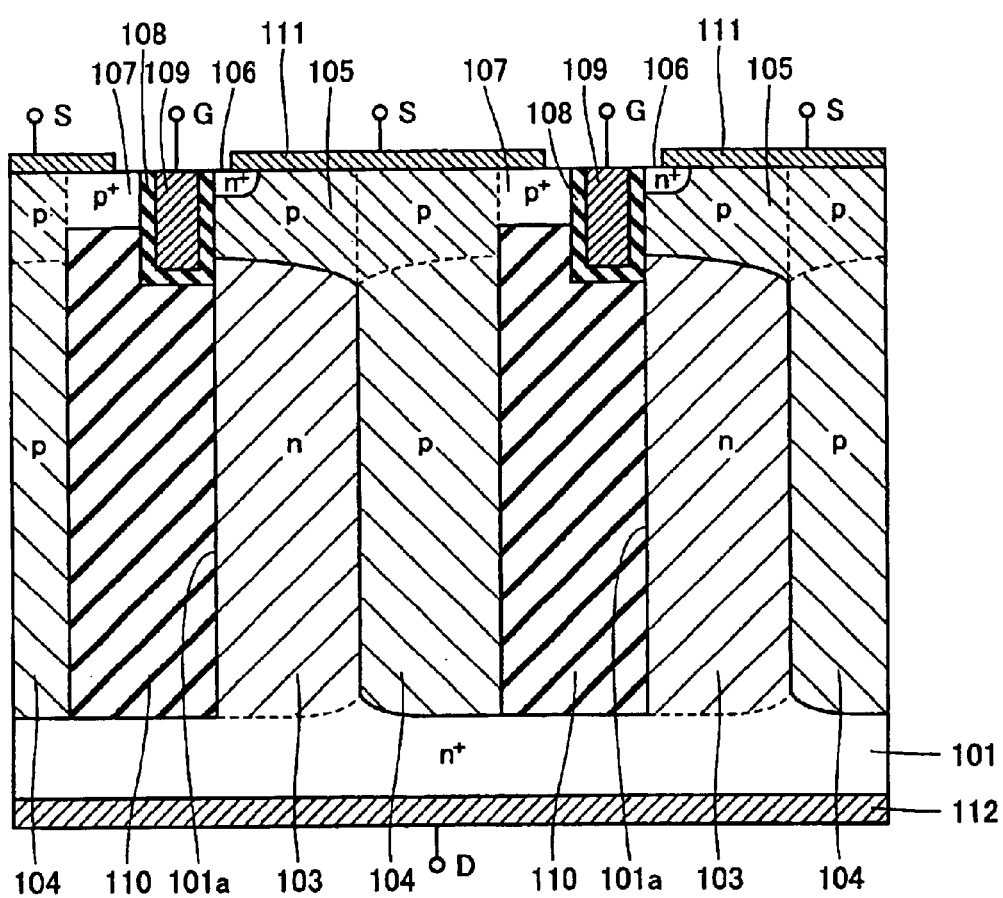
FIG. 19 is a schematic cross sectional view of a configuration of the STM disclosed in U.S. Pat. No. 6,040,600.

In FIG. 17, charged layer 71 is arranged in every gap between n type diffusion region 3 and p type diffusion region 4. Alternatively, when adjacent n type diffusion region 3 and p type diffusion region 4 constitute a pair as shown in FIG. 18, charged layer 71 may be arranged in every gap between the neighboring pairs.

In such a configuration, again, when n type and p type diffusion regions 3, 4 sandwiched between trenches 1a and charged layer 71 are regarded as a unit structure, a sum of an amount of positive charges and an amount of n type impurity within the unit structure is different from (or unbalanced with) a sum of an amount of negative charges and an amount of p type impurity within the same unit structure. That is, provision of charged layer 71 charged with positive or negative charges in the unit structure provides the similar effect as in the case where the impurity amounts in n type and p type diffusion regions within the unit structure are made unbalanced.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

As described above, the semiconductor device of the present invention is advantageously applicable to the field where high breakdown voltage and high avalanche breakdown tolerance are required.

What is claimed is:

1. A semiconductor device having a repeat structure of repeated unit structures in a semiconductor substrate of a first conductivity type, each unit structure having a first impurity region of the first conductivity type and a second impurity region of a second conductivity type in contact with each other to form a pn junction sandwiched between trenches, wherein said first impurity region and said second impurity region in each said unit structure have effective doses unequal to each other such that a ratio of the effective dose in said second impurity region to the effective dose in said first impurity region in each said unit structure is either one of not greater than 0.99 and not lower than 1.04.

2. The semiconductor device according to claim 1, wherein the ratio of the effective dose in said second impurity region to the effective dose in said first impurity region in each said unit structure is either one of not lower than 0.95 and not greater than 0.99, and not lower than 1.04 and not greater than 1.10.

3. The semiconductor device according to claim 1, wherein an insulative gate type field effect transistor is formed at a main surface of said semiconductor substrate sandwiched between said trenches in each said unit structure.

4. The semiconductor device according to claim 1, wherein said first impurity region and said second impurity region in each said unit structure serve as a diode.

5. The semiconductor device according to claim 1, wherein said first impurity region and said second impurity region in each said unit structure have impurity densities unequal to each other.

6. A semiconductor device having a repeat structure of repeated unit structures in a semiconductor substrate of a first conductivity type, each unit structure having a first impurity region of the first conductivity type and a second impurity region of a second conductivity type in contact with each other to form a pn junction sandwiched between trenches, wherein said first impurity region and said second impurity region in each said unit structure have effective doses unequal to each other, and wherein said first impurity region and said second impurity region in each said unit structure have volumes unequal to each other.

7. The semiconductor device according to claim 1, wherein said semiconductor substrate is made of SiC.

8. The semiconductor device according to claim 1, further comprising a third impurity region of the second conductivity type formed in each said unit structure in contact with an upper surface of said second impurity region and jutting out toward and in contact with a side surface, but not with an upper surface, of said first impurity region.

9. A semiconductor device having a repeat structure of repeated unit structures in a semiconductor substrate of a first conductivity type, each unit structure having a first impurity region of the first conductivity type and a second impurity region of a second conductivity type arranged in parallel with each other, comprising:

a charged layer arranged to contact at least one of said first impurity region and said second impurity region in each said unit structure;

wherein a sum of an amount of positive charges in said charged layer in each said unit structure and an amount of n type impurity in each said unit structure is unequal to a sum of an amount of negative charges in said charged layer in each said unit structure and an amount of p type impurity in each said unit structure.

* * * * *